United States Patent [19]
Fan

[11] Patent Number: 5,861,616
[45] Date of Patent: Jan. 19, 1999

[54] METHOD AND DEVICE FOR RECOGNIZING A WAVEFORM OF AN ANALOG SIGNAL

[75] Inventor: Chin-Chin Fan, Hsin-Chu, Taiwan

[73] Assignee: Mustek Systems, Inc., Hsin-Chu, Taiwan

[21] Appl. No.: 723,060

[22] Filed: Oct. 1, 1996

[51] Int. Cl.[6] .................................................. G06K 7/10
[52] U.S. Cl. ...................... 235/462; 235/463; 235/494; 382/273
[58] Field of Search ..................................... 235/462, 454, 235/439, 463, 494; 382/272, 273

[56] References Cited

U.S. PATENT DOCUMENTS

| | | | |
|---|---|---|---|
| 3,599,151 | 8/1971 | Harr | 382/273 |
| 3,675,201 | 7/1972 | McKissick et al. | 382/273 |
| 4,143,356 | 3/1979 | Nally | 382/273 X |
| 4,356,389 | 10/1982 | Quirey et al. | 382/273 X |
| 4,360,798 | 11/1982 | Swartz et al. | 382/273 X |
| 4,467,196 | 8/1984 | Balliet et al. | 235/462 X |
| 4,468,704 | 8/1984 | Stoffel et al. | 382/273 X |
| 4,525,747 | 6/1985 | Sakai et al. | 382/273 X |
| 4,556,916 | 12/1985 | Matsunawa | 382/273 X |
| 4,642,693 | 2/1987 | Fuse et al. | 382/273 X |
| 4,856,076 | 8/1989 | Maeda | 382/273 |
| 5,159,340 | 10/1992 | Smith | 235/463 X |
| 5,189,710 | 2/1993 | Holt | 382/273 |
| 5,296,940 | 3/1994 | Kawashima | 382/273 X |
| 5,514,858 | 5/1996 | Ackley | 235/462 |
| 5,583,659 | 12/1996 | Lee et al. | 382/273 X |

FOREIGN PATENT DOCUMENTS 61-90283  5/1986  Japan .
63-16393  1/1988  Japan .

Primary Examiner—Michael G. Lee
Attorney, Agent, or Firm—Knobbe Martens Olson & Bear, LLP

[57] ABSTRACT

A method and device for recognizing a waveform of an analog signal into a binary digital signal is developed. The method includes a) inputting the analog signal, b) determining voltage values of every peak and every valley of the analog signal respectively, c) determining a plurality of threshold voltages for the analog signal such that each the threshold voltage corresponds to mutually adjacent peak and valley and two adjacent respective the threshold voltages have a corresponding common one of the respective peak and the respective valley, and d) comparing each point of the waveform of the analog signal with the corresponding threshold voltage respectively for obtaining the digital signal. A real time device with a simple circuit is also available.

22 Claims, 10 Drawing Sheets

METHOD AND DEVICE FOR RECOGNIZING A WAVEFORM OF AN ANALOG SIGNAL

FIELD OF THE INVENTION

The present invention relates to the field of waveform recognition, and more particularly, to the field of converting an analog image signal into a binary digital signal.

BACKGROUND OF THE INVENTION

Optically sensing devices such as charge coupled device (CCD) are widely used in image readers. Referring to FIG. 1, an inputted image signal 11 is broadened by the optical sensing device 12, which will trouble the recognition of the waveform when converting the inputted analog data into a binary digital signal.

There are two conventional methods for converting an analog signal from an image reader to a binary digital signal. The first method is to take a second differentiation of the waveform of the analog signal to obtain the edge of the waveform. Because a differentiation to a waveform is analogic to a high-pass filter to an analog signal, which will be coupled with a lot of disturbance signals, and thus decrease the accuracy in reading image data.

Another method is to take a voltage value, normally a mean value of the maximum and the minimum voltage of the analog signal, as a threshold voltage. The point having a higher voltage value than the threshold voltage is considered to have a high level voltage in the binary digital signal, while the lower voltage value point is considered as a low level voltage. This method is invalid in a high resolution requiring job, thus an optical character recognition (OCR) process will fail without a high image quality.

SUMMARY OF THE INVENTION

An object of the present invention is to provide a method for converting a broadened analog image signal into a binary digital signal with a dynamic threshold voltage.

Another object of the present invention is to determine a threshold signal for a digitizer.

Another object of the present invention is to provide a device for recognizing the waveform of a broadened analog signal.

A further object of the present invention is to provide a real time waveform-recognition method for converting an image signal from an image reading device.

Another object of the present invention is to provide a real time waveform-recognition device used in a CCD-based reader.

The present invention relates to a method for recognizing a waveform of an analog signal having a plurality of peaks and valleys while converting said analog signal into a digital signal, the method includes: a) inputting the analog signal, b) determining voltage values of every peak and every valley of the analog signal respectively, c) determining a plurality of threshold voltages for the analog signal such that each the threshold voltage corresponds to mutually adjacent peak and valley and two adjacent respective the threshold voltages have a corresponding common one of the respective peak and the respective valley, and d) comparing each point of the waveform of the analog signal with the corresponding threshold voltage respectively for obtaining the digital signal.

In accordance with one aspect of the present invention, the analog signal is preferably a broadened signal from a photosensitive device.

In accordance with another aspect of the present invention, the digital signal is preferably a binary image signal having a high level voltage and a low level voltage.

In accordance with another aspect of the present invention, wherein in the step d), any point of the waveform of the analog signal having a voltage value greater than the corresponding threshold voltage is preferably considered as the high level voltage in the binary image signal, and any point of the waveform of the analog signal having a voltage value less than the corresponding threshold voltage is preferably considered as the low level voltage in the binary image signal.

In accordance with another aspect of the present invention, the corresponding threshold voltage is preferably ranged between the corresponding peak voltage and the corresponding valley voltage.

In accordance with another aspect of the present invention, the corresponding threshold voltage is preferably an arithmetic mean of the corresponding peak voltage and the corresponding valley voltage.

The corresponding threshold voltage is preferably a geometric mean of the corresponding peak voltage and the corresponding valley voltage.

In accordance with another aspect of the present invention, the analog signal is preferably stored in a memory in a digital form after being inputted.

The corresponding peak voltage and the corresponding valley voltage are preferably determined by numerically processing the digital form of the analog signal.

Values of the corresponding peak voltage and the corresponding valley voltage are preferably local extremes of the analog signal.

The present invention further relates to a waveform recognition device for an analog signal to be converted into a binary image digital signal, wherein the analog signal has a plurality of peaks and valleys, the device includes an A/D converting device for converting the analog signal into one of a digital form, a memory device for storing the digital form corresponding to the analog signal, a computing device for determining peak voltages for the peaks respectively and valley voltages for the valleys respectively, and for determining a plurality of threshold voltages for the analog signal such that each the threshold voltage corresponds to mutually adjacent peak and valley and two adjacent the threshold voltages have a corresponding common one of the respective peak and the respective valley, and a comparing device for comparing each point of the waveform of the analog signal with the threshold voltage to thus obtain the binary image digital signal.

In accordance with another aspect of the present invention, values of the peak voltage and the valley voltage are preferably local extremes of the analog signal.

The corresponding threshold voltage is preferably ranged between the corresponding peak voltage and the corresponding valley voltage.

The corresponding threshold voltage is preferably an arithmetic mean of the corresponding peak voltage and the corresponding valley voltage.

In accordance with another aspect of the present invention, the corresponding threshold voltage is preferably a geometric mean of the corresponding peak voltage and the corresponding valley voltage.

In accordance with another aspect of the present invention, the binary image signal preferably has a high level voltage and a low level voltage.

Any point of the analog signal having a voltage value greater than the corresponding threshold voltage is preferably considered as the high level voltage in the binary image signal, and any point of the waveform of the analog signal having a voltage value less than the corresponding threshold voltage is considered as the low level voltage in the binary image signal.

In accordance with another aspect of the present invention, the computing device and the comparing device are preferably included in a central processing unit.

In accordance with another aspect of the present invention, the analog signal is preferably an image signal from a photosensitive device.

The photosensitive device is preferably a CCD-based image reader.

The CCD-based image reader is preferably a bar-code reader.

In accordance with another aspect of the present invention, the CCD-based image reader is preferably an optical character recognition scanner.

The present invention further relates to a real time method for recognizing a waveform of an analog signal having a plurality of peaks and a plurality of valleys while converting the analog signal into a digital signal; including a) inputting the analog signal into a detector for obtaining an upper edge voltage and a lower edge voltage, b) determining a threshold voltage according to the upper edge voltage and the lower edge voltage, and c) comparing the threshold voltage with the analog signal for obtaining a corresponding point of the digital signal.

The detector preferably includes a peak detector for generating the upper edge voltage, and a valley detector for generating the lower edge voltage.

The analog signal is preferably a signal from a photosensitive device.

The analog signal is preferably a broadened signal.

The digital signal is preferably a binary image digital signal.

In accordance with another aspect of the present invention, the threshold voltage is preferably ranged between the upper edge voltage and the lower edge voltage.

The threshold voltage is preferably an arithmetic mean of the upper edge voltage and the lower edge voltage.

In accordance with another aspect of the present invention, the threshold voltage is preferably a geometric mean of the upper edge voltage and the lower edge voltage.

The present invention further relates to a real-time waveform recognizing device for converting an analog signal into a binary digital signal, including a detecting device for detecting a peak and a valley of the analog signal and generating an upper edge voltage signal in response to the peak and a lower edge voltage signal in response to the valley, a computing device for obtaining a threshold voltage by computing a mean voltage value of the upper edge voltage signal and the lower edge voltage signal, and a comparing device for comparing the analog signal with the threshold voltage for obtaining a corresponding point of the binary digital signal.

In accordance with another aspect of the present invention, the detecting device preferably further includes a peak detector and a valley detector.

The peak detector and the valley detector respectively preferably include a diode and an RC circuit.

The peak detector detects a positive voltage of the analog signal and the valley detector detects a negative voltage of the analog signal.

The peak detector generates the upper edge voltage signal and the valley detector generates the lower edge voltage signal.

The threshold voltage is preferably located between voltage values of the upper edge voltage signal and the lower edge voltage signal.

The threshold voltage is preferably an arithmetic mean of voltage values of the upper edge voltage signal and the lower edge voltage signal.

In accordance with another aspect of the present invention, the voltage value is preferably a geometric mean of voltage values of the upper edge voltage signal and the lower edge voltage signal.

In accordance with another aspect of the present invention, the computing device preferably includes an adder.

In accordance with another aspect of the present invention, the computing device preferably further includes a divider.

In accordance with another aspect of the present invention, the comparing device is preferably a comparator.

In accordance with another aspect of the present invention, the analog signal is preferably an image signal from a photosensitive device.

The analog signal is preferably a broadened signal.

The photosensitive device is preferably a CCD-based image reader.

The CCD-based image reader is preferably a bar-code reader.

In accordance with another aspect of the present invention, the CCD-based image reader is an optical character recognition scanner.

The present invention may best be understood through the following description with reference to the accompanying drawings, in which:

DETAILED DESCRIPTION OF THE PREFERRED EMBODIMENTS

Figure 1:
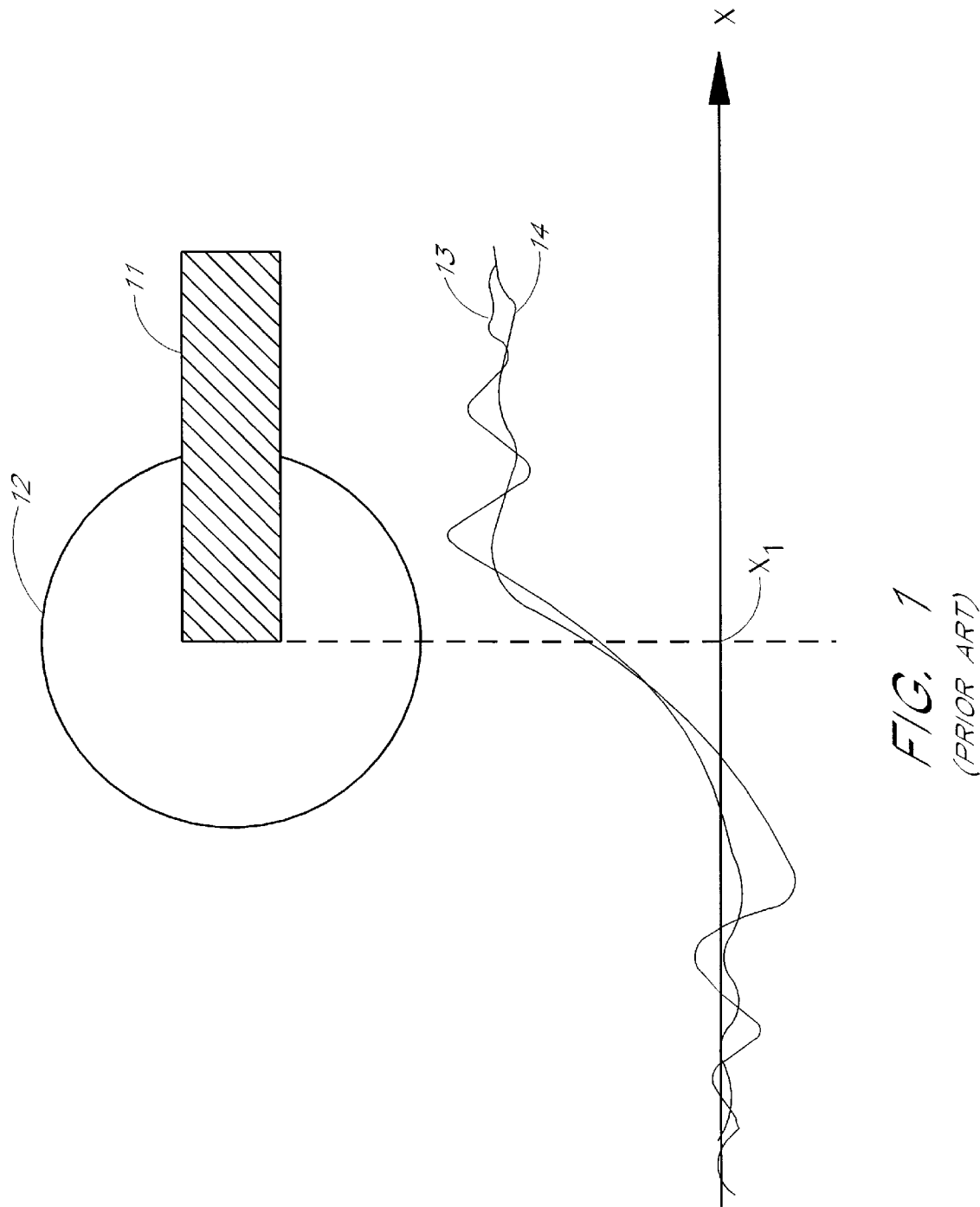
FIG. 1 is an illustration of the broadened signal of a pattern read by an optical system.
Figure 2:
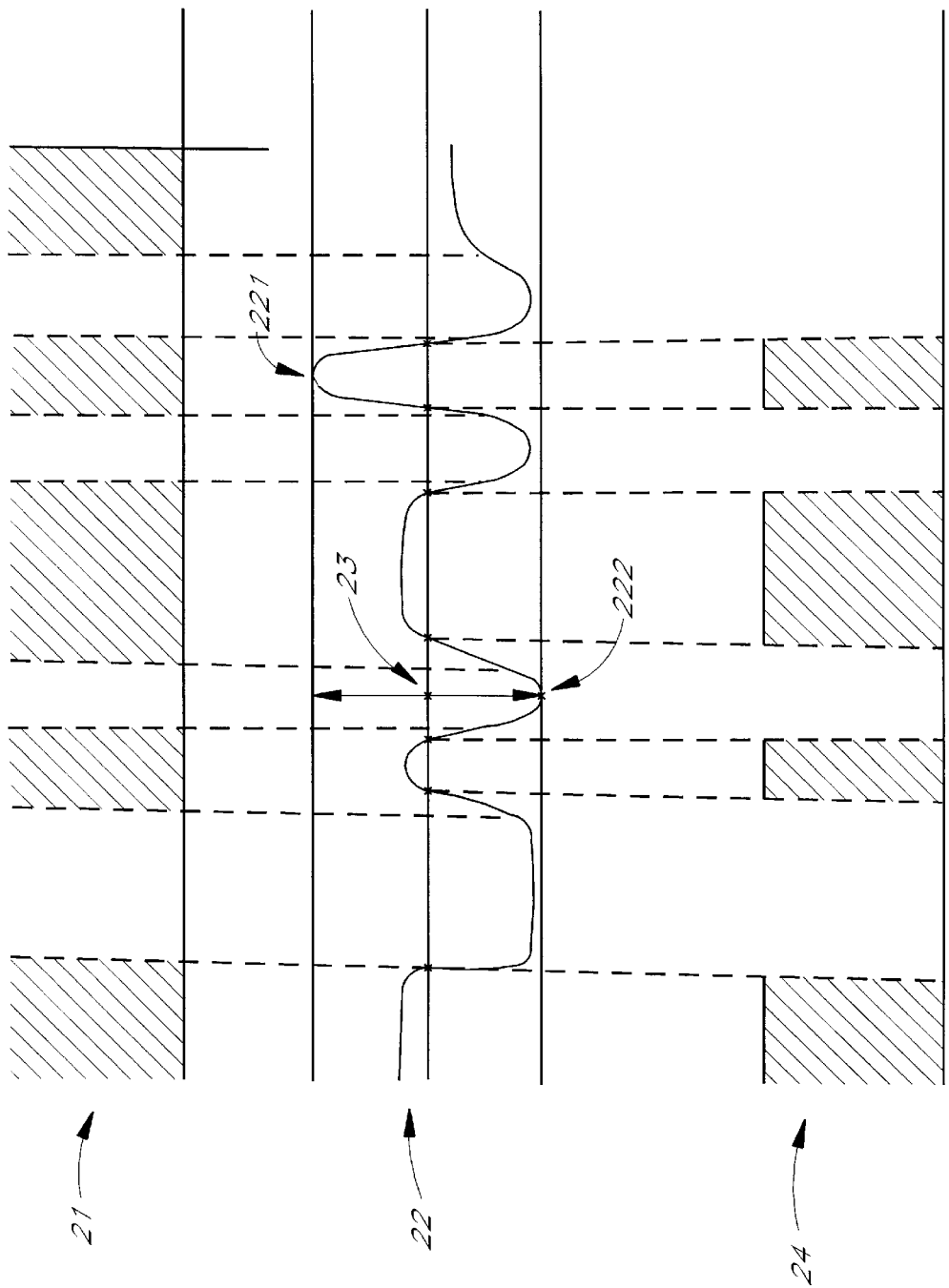
FIG. 2 is an illustration of a broadened signal of a bar-code read by an optical system.
Figure 3:
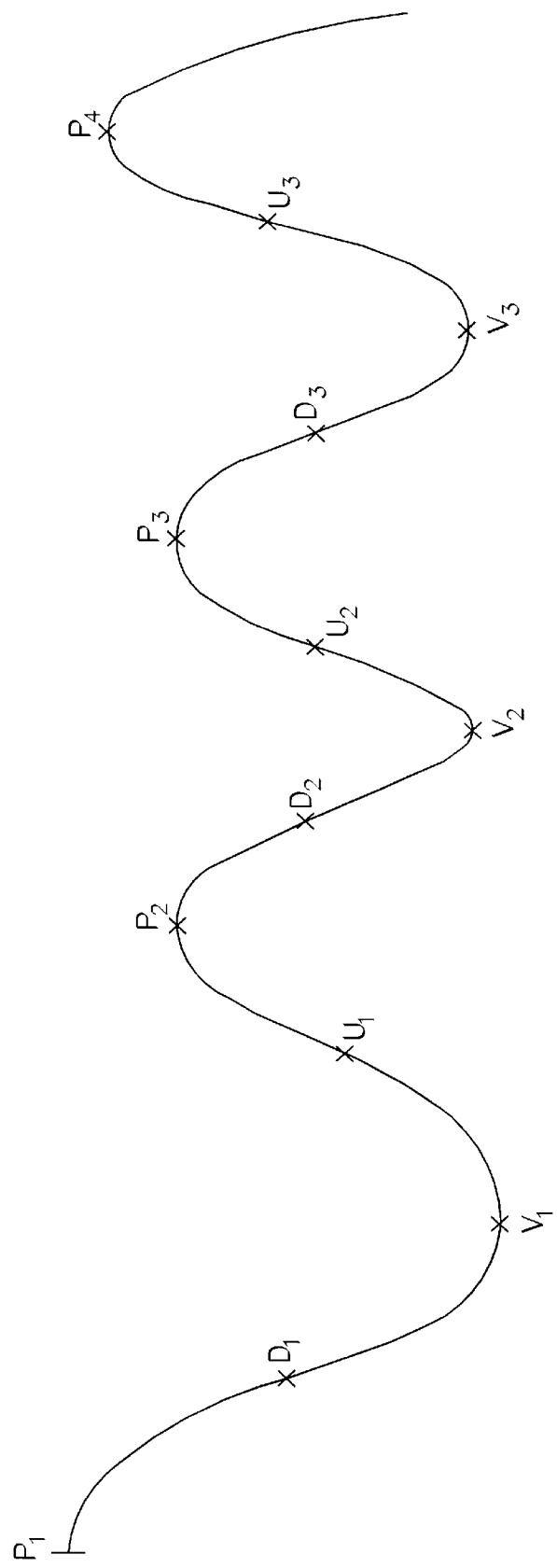
FIG. 3 is an illustration of the waveform recognition method according to the present invention.
Figure 4:
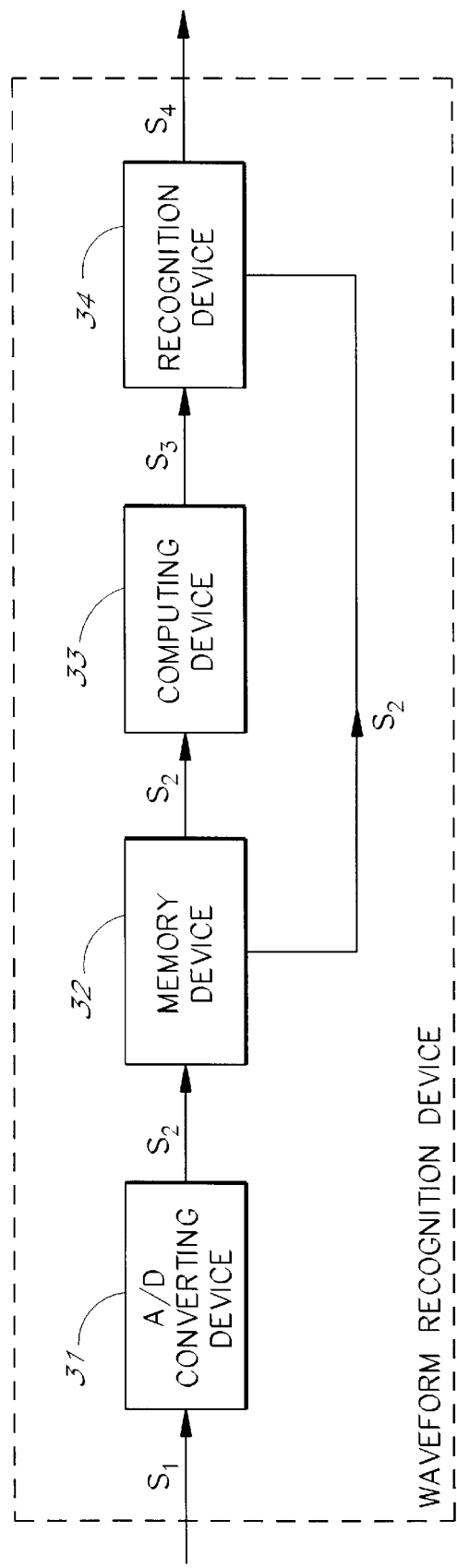
FIG. 4 is a block diagram of the waveform recognition device according to the present invention.

Referring to FIG. 2, a bar-code 21 is read by an optical system and a broadened signal 22 is obtained. A conventional method for recognizing the waveform is to take a fixed threshold voltage 23 by averaging the maxim value 221 and the minimum value 222 of the broadened signal 22. The recognized digital signal 24 is obtained by considering the voltage values of points of the broadened signal 22 which has a voltage value greater than the threshold voltage 23 as 1, and the other points as 0. Comparing the recognized digital signal 24 with the inputted bar-code 21, errors obviously exist because the differences between each peak and each valley are ignored when using the fixed threshold voltage. To solve this problem, the present invention develops a "dynamic threshold" method, that is, the value of threshold voltage is variable with each adjacent peak and valley. Referring to FIG. 3, wherein P1, P2, P3 and P4 are voltage values of the peaks, while V1, V2 and V3 are valley voltage values. D1, U1, D2, U2, D3 and U3 are chosen as the threshold voltages of (P1, V1), (V1, P2), (P2, V2), (V2, P3), (P3, V3) and (V3, P4), respectively. Accordingly, the points between (P1, D1), (U1, D2), (U2, D3) and (U3, P4) are considered to have a voltage value of "1", while the points between (D1, U1), (D2, U2) and (D3, U3) have voltage value of "0". Methods for determining the threshold voltages have been tested. It has been found that when choosing the mean value of each adjacent peak and valley as the threshold voltage, that is, $D1=(P1+V1)/2$, $D2=(P2+V2)/2$, $D3=(P3+V3)/2$, ... and $U1=(V1+P2)/2$, $U2=(V2+P3)/2$, ..., a relatively small error will be obtained. The device for executing the recognition is preferably a computer or a device having CPU and memory. Referring to the waveform recognition device illustrated in FIG. 4, an analog signal S1 is inputted into an A/D converting device 31 to obtain a digital form S2. The digital form S2 of the analog signal S1 is stored in a memory device 32. Then the digital form S2 is inputted into the computing device for finding the coordinates of the local extreme P1, P2, P3 ..., and V1, V2, V3 ... of the analog signal S1, according to a software. D1, D2, D3 ..., and U1, U2, U3 ... are then obtained by averaging (P1, V1), (P2, V2), (P3, V3), ... and (V1, P2), (V2, P3), (V3, P4), .... The obtained D1, D2, D3, ... and U1, U2, U3, ... are used to build a reference curve S3. Finally, the digital signal S4 is obtained by comparing the original signal with the reference curve S3 in the comparing device 44 indicated in FIG. 5.

The work for finding the peak voltage and the valley voltage can be finished by a set of peak detectors, instead of a computer or a device including a CPU and a memory. The peak detector includes an RC circuit and a diode. After charged by a peak, the peak detector will discharge until it is charged by the next peak, thus an upper edge voltage signal is formed. Similarly, an lower edge voltage signal is formed by the discharge of a valley detector. The mean value of the peak voltage and the valley voltage can be approximated by averaging the upper edge signal and the lower edge signal, without numerically processing the digital form of the analog signal.

Figure 5:
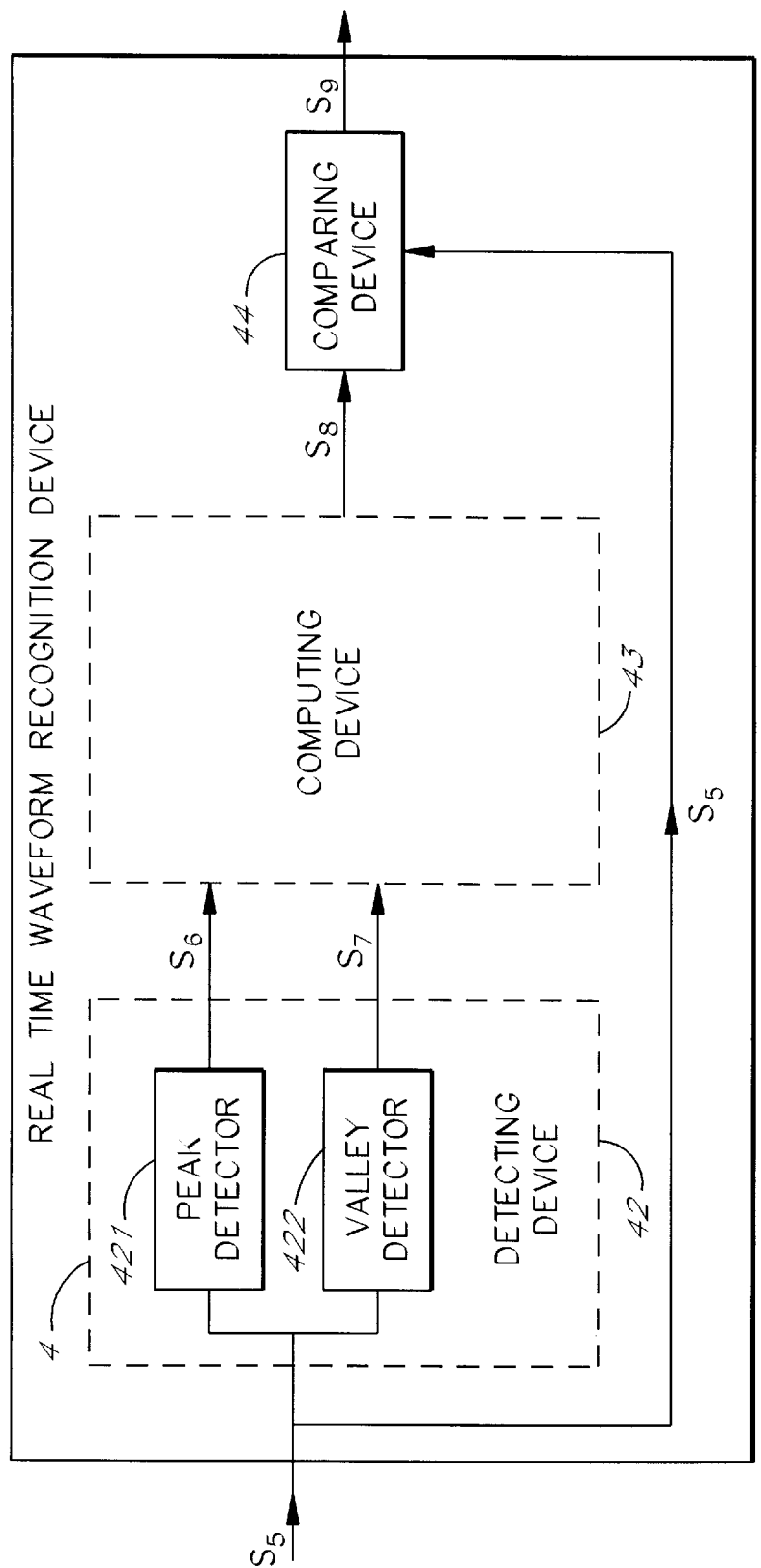
FIG. 5 is a block diagram of a preferred embodiment of the real time waveform recognition device according to the present invention.

Accordingly, a real time waveform recognition device 4 shown in FIG. 5 is developed. The analog signal S5 is inputted into the detecting device 42. The peak detector 421 generates the upper edge signal S6 in response to the peaks of the analog signal S5, while the valley detector 422 generates the lower edge signal S7 in response to the valleys. The upper edge voltage signal S6 and the lower edge voltage signal S7 are averaging by the computing device to obtain a threshold voltage curve S8. The analog signal S5 is then compared with the threshold voltage curve S8 by the comparing device 44, thus obtains the digital signal S9.

Figure 6:
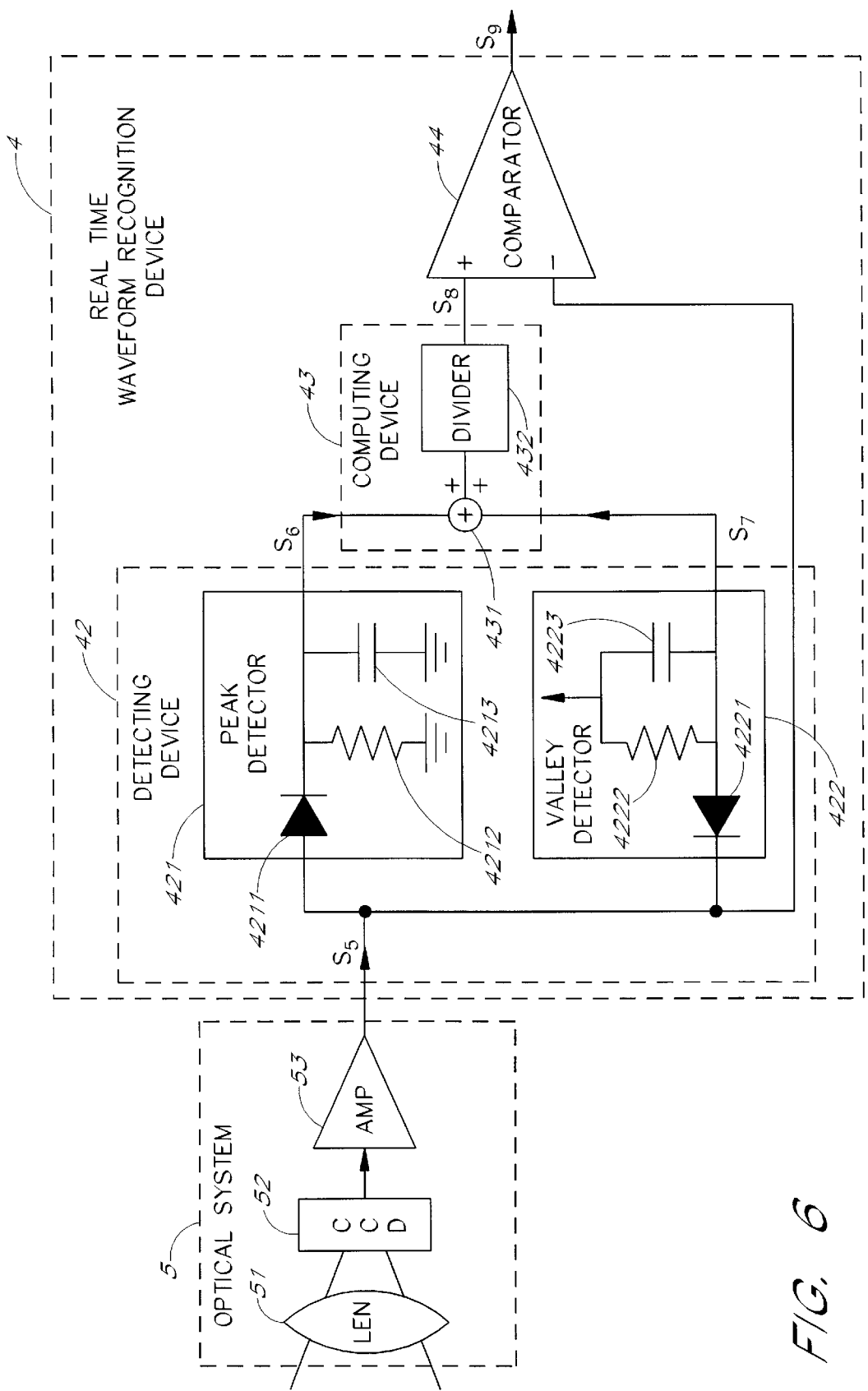
FIG. 6 illustrates a preferred embodiment of the real time waveform recognition device according to the present invention.

A preferred embodiment of the real time waveform recognition device 4 is shown in FIG. 6. A bar-code or an OCR original is read by an optical system 5 including optical lens 51, a charge-coupled device 52 and an amplifier 53 to generate the analog signal S5. The peak detector 421 includes a diode 4211 serially connected with a RC circuit containing a resistor 4212 and a capacitor 4213. The valley detector 422 includes a diode 4221 serially connected with an RC circuit containing a resistor 4222 and a capacitor 4223. The diodes 4211 and 4212 conduct in opposite direction, and the RC circuits of the peak detector 421 and the valley detector 422 are grounded in different places for respectively detecting the peaks and the valleys of the analog signal S5. The computing device 43 includes an adder 431 and a divider 432 to average the upper edge voltage signal S6 from the peak detector 421 and the lower edge voltage signal S7 from the valley detector 422. The obtained threshold voltage curve S8 is then inputted into the comparator 44 to compare with the analog signal S5, thus obtain the digital signal S9.

Figure 7:
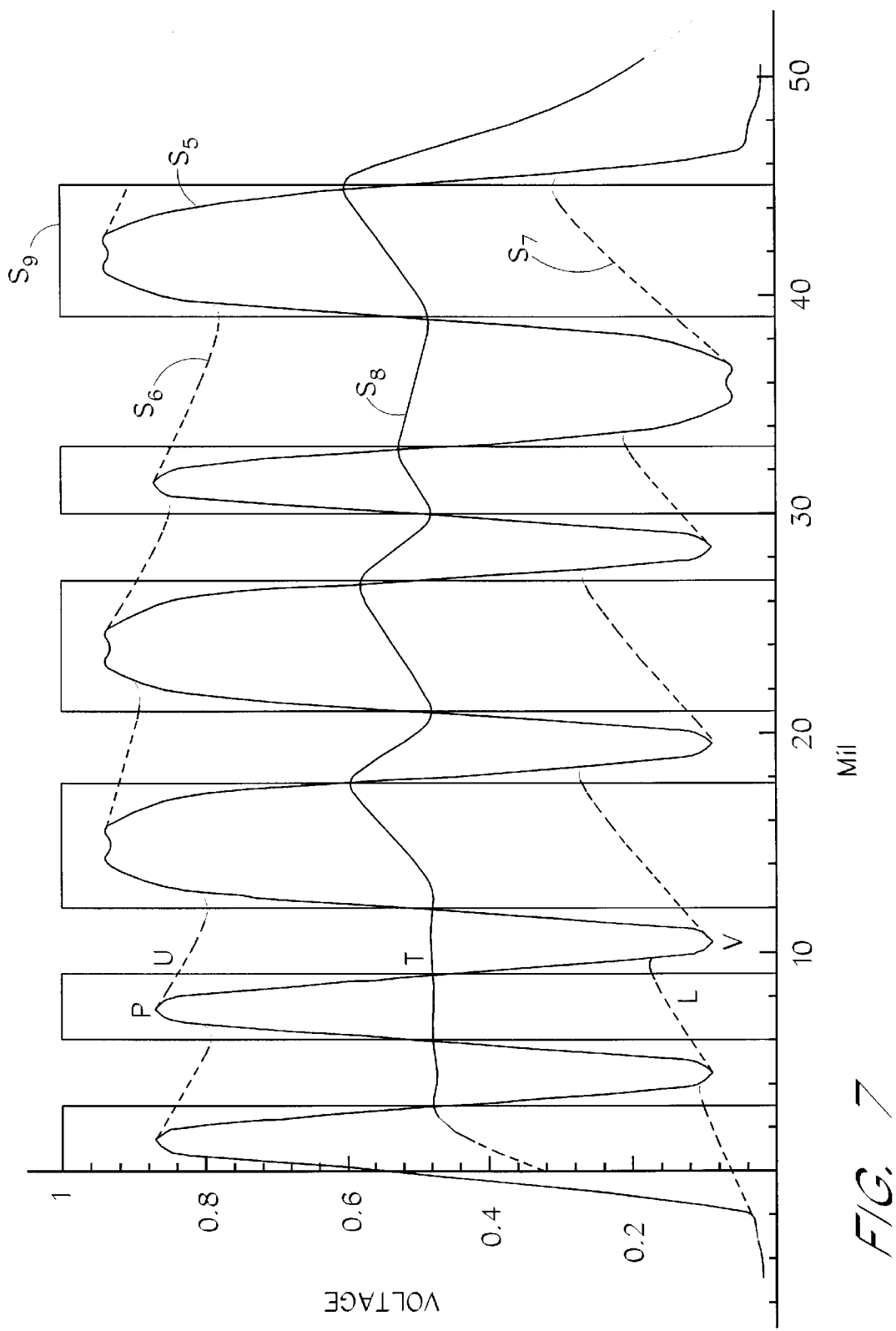
FIG. 7 illustrates a preferred embodiment according to the real time waveform recognition method of the present invention.

Referring to FIG. 7, The threshold voltage curve S8 is built by averaging the upper edge voltage signal S6 and the lower edge voltage signal S7. To obtain the digital signal S9, the points of the analog signal S5 above the threshold voltage curve S8 are considered to have a voltage value of "1", while those under the threshold voltage are considered as "0". It is obvious that the threshold voltage T, a mean value of the upper edge voltage U and the lower edge voltage L, approximates the mean value of the peak voltage P and the valley voltage V.

Figure 8:
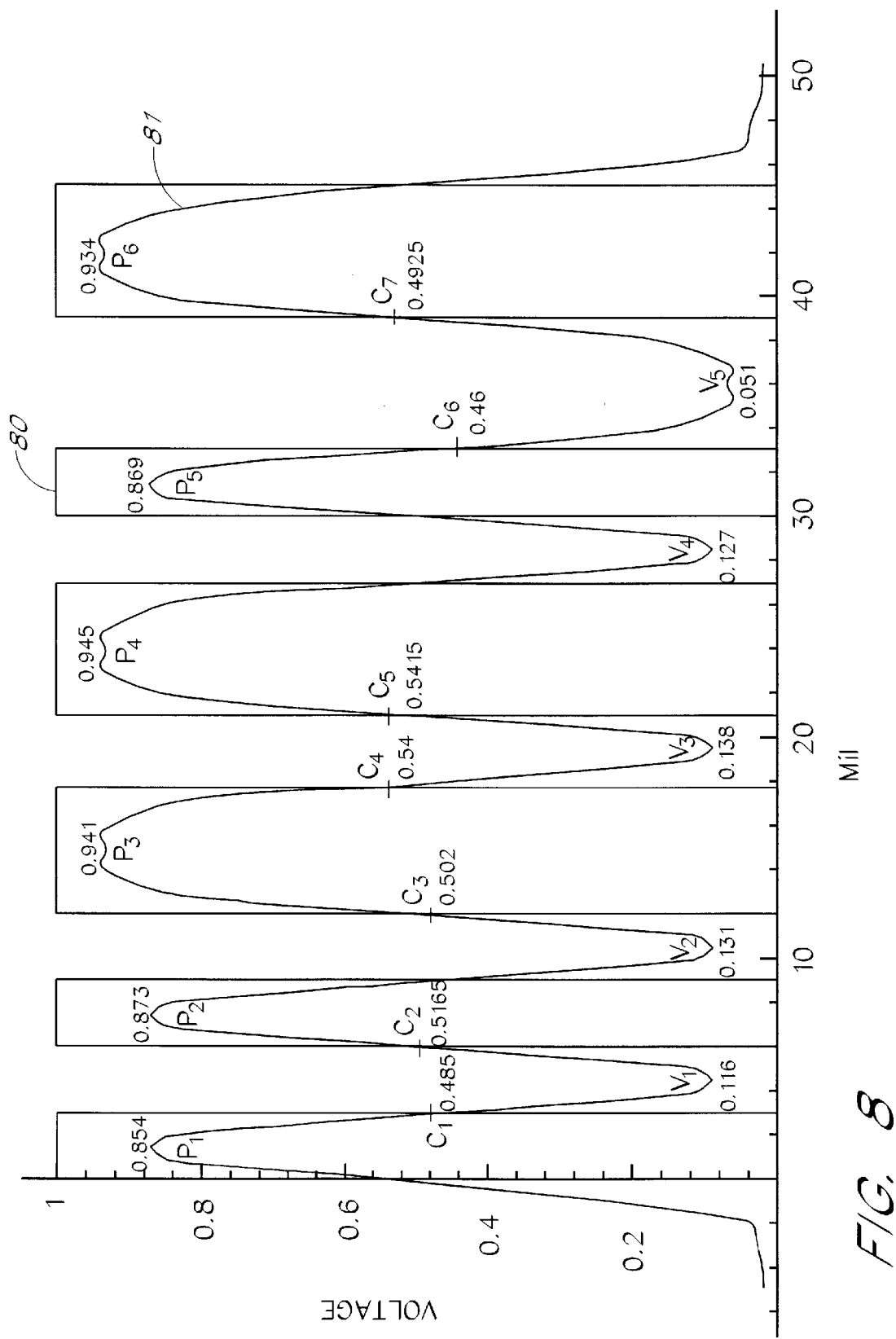
FIG. 8 illustrates an image signal obtained from observing a bar-code having a basic unit of 3 mil by an optical system having a 5 mil spot resolution.
Figure 9:
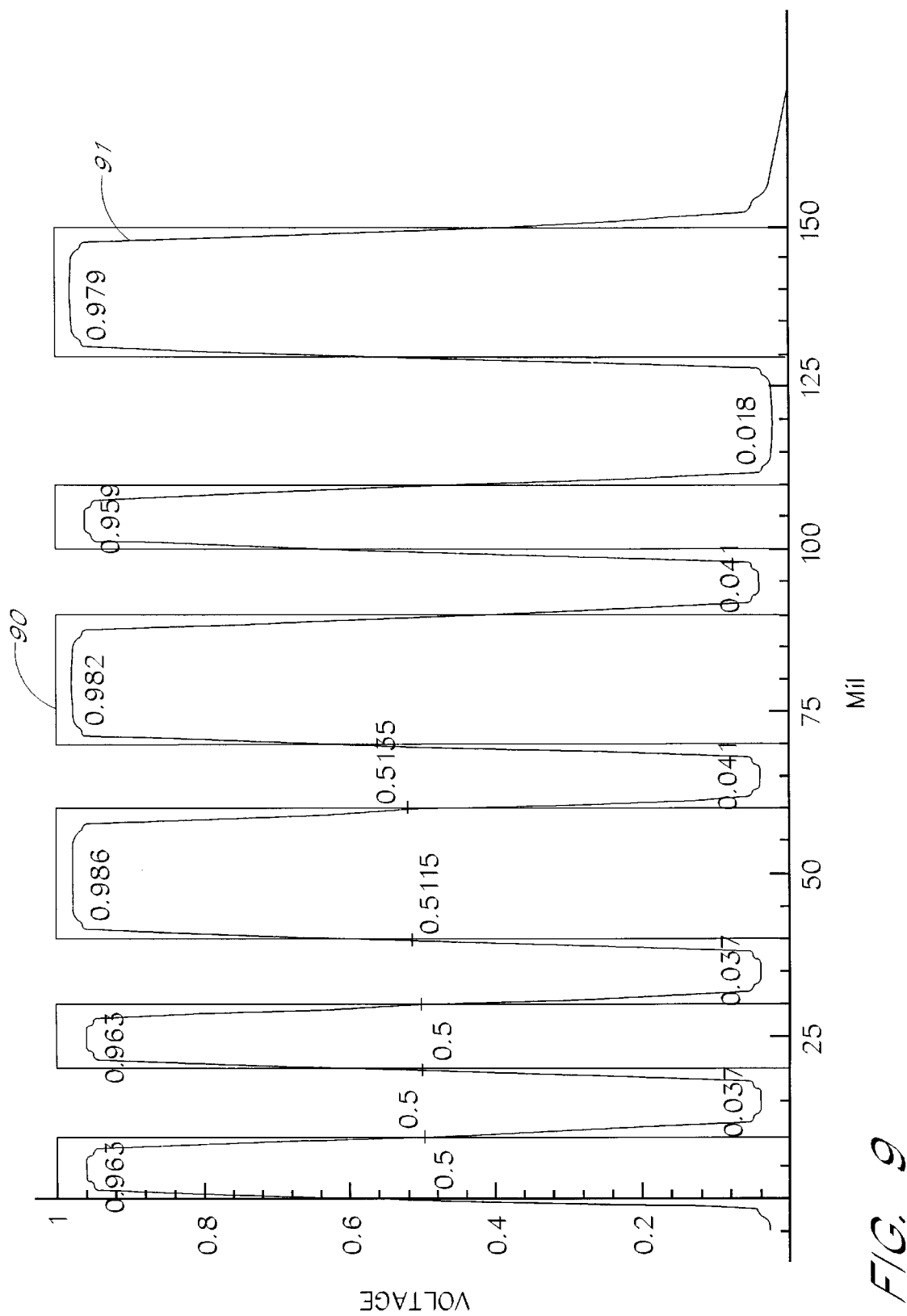
FIG. 9 illustrates an image signal obtained from observing a bar-code having a basic unit of 10 mil by an optical system having a 5 mil spot resolution.
Figure 10:
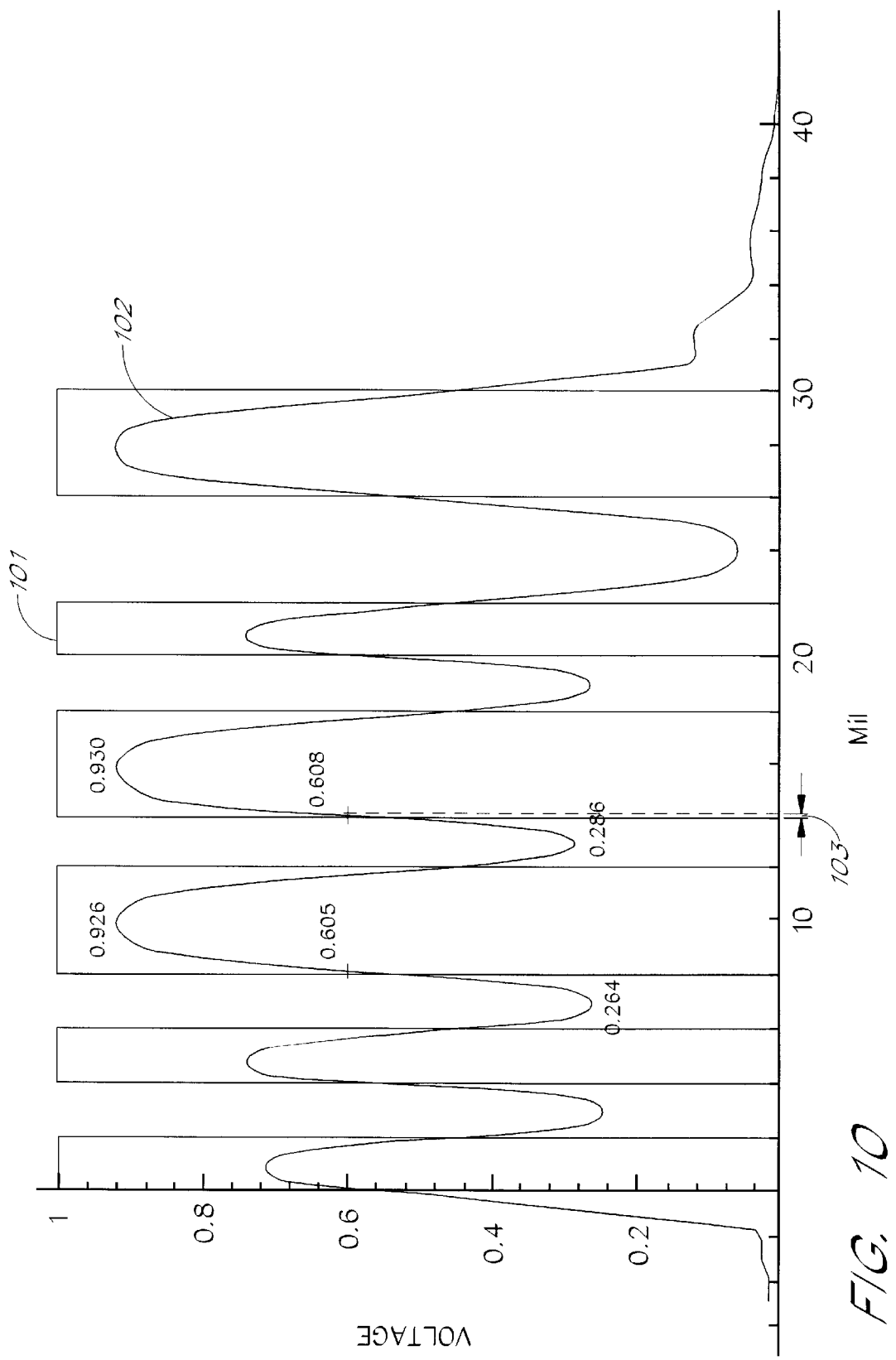
FIG. 10 illustrates an image signal obtained from observing a bar-code having a basic unit of 2 mil by an optical system having a 5 mil spot resolution.

Referring to FIG. 8, a bar-code 80 having a basic unit of 3 mil is read by an optical system having a spot resolution of 5 mil. A broadened signal 81 is obtained. C1, C2, ... C6, are centers of (P1, V1), (V1, P2), ... (P5, V5) respectively. It is obvious that each center serves as a good threshold voltage for its relative peak and valley with less error. Comparing among FIGS. 8–10, it could be found that under the same spot resolution (5 mil), the smaller is the basic unit of the bar-code, the greater is the difference between the bar-code and the broadened signal. As indicated in FIG. 10, even a 2-mil basic unit bar-code is observed by a 5-mil spot-resolution optical system, the error 103 caused by using the peak-and valley-center threshold voltage is only about 0.5 mil. In the other words, the recognition method of the present invention is very reliable.

The choice of the threshold voltage is not limited in the center of the peak and the valley. Any point between the peak and the valley such as a geometric mean of the peak and the valley can be chose according to the character of the analog signal. In a word, a dynamic threshold method can bring a more exactly waveform recognition than the conventional fixed threshold method does.

While the invention has been described in terms of what are presently considered to be the most practical and preferred embodiments, it is to be understood that the invention needs not be limited to the disclosed embodiment. On the country, it is intended to cover various modifications and similar arrangements included within the spirit and scope of the appended claims which are to be accorded with the broadest interpretation so as to encompass all such modifications and similar structures.

What is claimed is:

1. A method for recognizing a waveform of an analog signal having a plurality of peaks and valleys while converting said analog signal into a digital signal, said method comprising:

a) inputting said analog signal;

b) determining voltage values of every peak and every valley of said analog signal respectively;

c) determining a plurality of threshold voltages for said analog signal such that each said threshold voltage corresponds to mutually adjacent peak and valley and two adjacent respective said threshold voltages have a corresponding common one of said respective peak and said respective valley; and d) comparing each point of said waveform of said analog signal with said corresponding threshold voltage respectively for obtaining said digital signal.

2. A method according to claim 1, wherein said analog signal is a broadened signal from a photosensitive device.

3. A method according to claim 1, wherein said digital signal is a binary image signal having a high level voltage and a low level voltage.

4. A method according to claim 3, wherein in said step d), any point of said waveform of said analog signal having a voltage value greater than said corresponding threshold voltage is considered as said high level voltage in said binary image signal, and any point of said waveform of said analog signal having a voltage value less than said corresponding threshold voltage is considered as said low level voltage in said binary image signal.

5. A method according to claim 1, wherein said corresponding threshold voltage is ranged between said corresponding peak voltage and said corresponding valley voltage.

6. A method according to claim 5, wherein said corresponding threshold voltage is an arithmetic mean of said corresponding peak voltage and said corresponding valley voltage.

7. A method according to claim 5, wherein said corresponding threshold voltage is a geometric mean of said corresponding peak voltage and said corresponding valley voltage.

8. A method according to claim 1, wherein said analog signal is stored in a memory in a digital form after being inputted.

9. A method according to claim 8, wherein said corresponding peak voltage and said corresponding valley voltage are determined by numerically processing said digital form of said analog signal.

10. A method according to claim 9, wherein values of said corresponding peak voltage and said corresponding valley voltage are local extremes of said analog signal.

11. A waveform recognition device for an analog signal to be converted into a binary image digital signal, wherein said analog signal has a plurality of peaks and valleys, said device comprising:

an A/D converting device for converting said analog signal into one of a digital form;

a memory device for storing said digital form corresponding to said analog signal;

a computing device for determining peak voltages for said peaks respectively and valley voltages for said valleys respectively, and for determining a plurality of threshold voltages for said analog signal such that each said threshold voltage corresponds to mutually adjacent peak and valley and two adjacent said threshold voltages have a corresponding common one of said respective peak and said respective valley; and a comparing device for comparing each point of said waveform of said analog signal with said threshold voltage to thus obtain said binary image digital signal.

12. A device according to claim 11, wherein values of said peak voltage and said valley voltage are local extremes of said analog signal.

13. A device according to claim 12, wherein said corresponding threshold voltage is ranged between said corresponding peak voltage and said corresponding valley voltage.

14. A device according to claim 13, wherein said corresponding threshold voltage is an arithmetic mean of said corresponding peak voltage and said corresponding valley voltage.

15. A device according to claim 14, wherein said corresponding threshold voltage is a geometric mean of said corresponding peak voltage and said corresponding valley voltage.

16. A device according to claim 11, wherein said binary image signal has a high level voltage and a low level voltage.

17. A method according to claim 16, wherein any point of said analog signal having a voltage value greater than said corresponding threshold voltage is considered as said high level voltage in said binary image signal, and any point of said waveform of said analog signal having a voltage value less than said corresponding threshold voltage is considered as said low level voltage in said binary image signal.

18. A device according to claim 11, wherein said computing device and said comparing device is included in a central processing unit.

19. A device according to claim 11, wherein said analog signal is an image signal from a photosensitive device.

20. A device according to claim 19, wherein said photosensitive device is a CCD-based image reader.

21. A device according to claim 20, wherein said CCD-based image reader is a bar-code reader.

22. A device according to claim 20, wherein said CCD-based image reader is an optical character recognition scanner.

* * * * *